United States Patent
Choi et al.

(10) Patent No.: US 9,040,330 B2
(45) Date of Patent: May 26, 2015

(54) METHOD OF MANUFACTURING ORGANIC LIGHT-EMITTING DISPLAY APPARATUS

(71) Applicant: SAMSUNG DISPLAY CO., LTD., Yongin, Gyeonggi-Do (KR)

(72) Inventors: Myong-Hwan Choi, Yongin (KR); Woon-Hyun Choi, Yongin (KR); Kyoung-Won Oh, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/015,946

(22) Filed: Aug. 30, 2013

(65) Prior Publication Data

US 2014/0312318 A1    Oct. 23, 2014

(30) Foreign Application Priority Data

Apr. 18, 2013   (KR) .................. 10-2013-0043025

(51) Int. Cl.
*H01L 27/32* (2006.01)
(52) U.S. Cl.
CPC .................. *H01L 27/3272* (2013.01)
(58) Field of Classification Search
CPC .................................................. H01L 27/3272
USPC ............... 438/22, 28–30, 34, 46, 82, 99, 780
See application file for complete search history.

(56) References Cited

U.S. PATENT DOCUMENTS

| | | | |
|---|---|---|---|
| 4,687,939 A | 8/1987 | Miyauchi et al. |
| 6,091,195 A | 7/2000 | Forrest et al. |
| 6,274,198 B1 | 8/2001 | Dautartas |
| 6,280,821 B1 | 8/2001 | Kadunce et al. |
| 6,371,451 B1 | 4/2002 | Choi |
| 6,749,906 B2 | 6/2004 | Van Slyke |
| 6,878,209 B2 | 4/2005 | Himeshima et al. |
| 6,946,783 B2 | 9/2005 | Kim |
| 7,006,202 B2 | 2/2006 | Byun et al. |
| 7,537,798 B2 | 5/2009 | Shigemura |

(Continued)

FOREIGN PATENT DOCUMENTS

| | | |
|---|---|---|
| EP | 1 413 644 A2 | 4/2004 |
| EP | 1 418 250 A2 | 5/2004 |

(Continued)

OTHER PUBLICATIONS

Machine English Translation for JP-2001-052862 A, dated Feb. 23, 2001 listed above.

(Continued)

*Primary Examiner* — Thanh T Nguyen

(74) *Attorney, Agent, or Firm* — Christie, Parker & Hale, LLP

(57) ABSTRACT

A deposition apparatus includes (i) a sheet including a slit area, first and second dummy slit areas, and a binding area; and (ii) a frame. The slit area has a plurality of patterning slits that are extended along a first direction and arranged along a second direction crossing the first direction. The first and second dummy slit areas are outside the slit area along the second direction and along the opposite direction to the second direction respectively and have a plurality of dummy slits. The binding area surrounds the slit area and the first and second dummy slit areas. The frame is attached to the binding area of the sheet and shields at least some of the plurality of dummy slits of the first and second dummy slit areas.

8 Claims, 9 Drawing Sheets

(56) References Cited

U.S. PATENT DOCUMENTS

| | | | |
|---|---|---|---|
| 8,188,476 B2 | 5/2012 | Takagi et al. | |
| 8,193,011 B2 | 6/2012 | Kang et al. | |
| 8,598,783 B2 * | 12/2013 | Yamaguchi | 313/504 |
| 2001/0006827 A1 | 7/2001 | Yamazaki et al. | |
| 2002/0017245 A1 | 2/2002 | Tsubaki et al. | |
| 2002/0076847 A1 | 6/2002 | Yamada et al. | |
| 2002/0168577 A1 | 11/2002 | Yoon | |
| 2003/0101932 A1 | 6/2003 | Kang | |
| 2003/0101937 A1 | 6/2003 | Van Slyke et al. | |
| 2003/0118950 A1 | 6/2003 | Chao et al. | |
| 2003/0168013 A1 | 9/2003 | Freeman et al. | |
| 2003/0221614 A1 | 12/2003 | Kang et al. | |
| 2003/0232563 A1 | 12/2003 | Kamiyama et al. | |
| 2004/0115338 A1 | 6/2004 | Yoneda | |
| 2004/0115342 A1 | 6/2004 | Shigemura | |
| 2004/0127066 A1 | 7/2004 | Jung | |
| 2004/0134428 A1 | 7/2004 | Sasaki et al. | |
| 2004/0142108 A1 | 7/2004 | Atobe et al. | |
| 2004/0144321 A1 | 7/2004 | Grace et al. | |
| 2004/0183435 A1 | 9/2004 | Oshita | |
| 2004/0194702 A1 | 10/2004 | Sasaki et al. | |
| 2005/0016461 A1 | 1/2005 | Klug et al. | |
| 2005/0031836 A1 | 2/2005 | Hira | |
| 2005/0037136 A1 | 2/2005 | Yamamoto | |
| 2005/0072361 A1 | 4/2005 | Yang et al. | |
| 2005/0110400 A1 | 5/2005 | Nakamura | |
| 2005/0166842 A1 | 8/2005 | Sakamoto | |
| 2005/0263074 A1 | 12/2005 | Masuda et al. | |
| 2006/0022590 A1 | 2/2006 | Aziz et al. | |
| 2006/0110544 A1 | 5/2006 | Kim et al. | |
| 2006/0113907 A1 | 6/2006 | Im et al. | |
| 2006/0144325 A1 | 7/2006 | Jung et al. | |
| 2006/0174829 A1 | 8/2006 | An et al. | |
| 2006/0205101 A1 | 9/2006 | Lee et al. | |
| 2006/0272572 A1 | 12/2006 | Uematsu et al. | |
| 2007/0022955 A1 | 2/2007 | Bender et al. | |
| 2007/0054044 A1 | 3/2007 | Shimosaki et al. | |
| 2007/0077358 A1 | 4/2007 | Jeong et al. | |
| 2007/0148337 A1 | 6/2007 | Nichols et al. | |
| 2007/0157879 A1 | 7/2007 | Yotsuya | |
| 2007/0163497 A1 | 7/2007 | Grace et al. | |
| 2007/0178708 A1 | 8/2007 | Ukigaya | |
| 2008/0018236 A1 | 1/2008 | Arai et al. | |
| 2008/0100201 A1 | 5/2008 | Wei et al. | |
| 2008/0115729 A1 | 5/2008 | Oda et al. | |
| 2008/0129194 A1 | 6/2008 | Abe et al. | |
| 2008/0131587 A1 | 6/2008 | Boroson et al. | |
| 2008/0145521 A1 | 6/2008 | Guo et al. | |
| 2008/0174235 A1 | 7/2008 | Kim et al. | |
| 2008/0216741 A1 | 9/2008 | Ling et al. | |
| 2008/0238294 A1 | 10/2008 | Xu et al. | |
| 2009/0017192 A1 | 1/2009 | Matsuura | |
| 2009/0220691 A1 | 9/2009 | Kim | |
| 2009/0232976 A1 | 9/2009 | Yoon et al. | |
| 2009/0277386 A1 | 11/2009 | Takagi et al. | |
| 2010/0001301 A1 | 1/2010 | Karg et al. | |
| 2010/0055810 A1 | 3/2010 | Sung et al. | |
| 2010/0192856 A1 | 8/2010 | Sung et al. | |
| 2010/0196607 A1 | 8/2010 | Carlson et al. | |
| 2010/0271602 A1 | 10/2010 | Hanazaki | |
| 2011/0220019 A1 | 9/2011 | Lee et al. | |

FOREIGN PATENT DOCUMENTS

| | | |
|---|---|---|
| EP | 1 518 940 A1 | 3/2005 |
| JP | 04-272170 A | 9/1992 |
| JP | 2000-068054 A | 3/2000 |
| JP | 2001-052862 A | 2/2001 |
| JP | 2001-093667 A | 4/2001 |
| JP | 2002-075638 A | 3/2002 |
| JP | 2002-175878 A | 6/2002 |
| JP | 2003-003250 A | 1/2003 |
| JP | 2003-077662 A | 3/2003 |
| JP | 2003-157973 A | 5/2003 |
| JP | 2003-297562 A | 10/2003 |
| JP | 2003-321767 A | 11/2003 |
| JP | 2004-043898 A | 2/2004 |
| JP | 2004-103269 A | 4/2004 |
| JP | 2004-103341 A | 4/2004 |
| JP | 2004-169169 A | 6/2004 |
| JP | 2004-199919 A | 7/2004 |
| JP | 2004-349101 A | 12/2004 |
| JP | 2005-044592 A | 2/2005 |
| JP | 2005-122980 A | 5/2005 |
| JP | 2005-174843 A | 6/2005 |
| JP | 2005-235568 A | 9/2005 |
| JP | 2005-293968 A | 10/2005 |
| JP | 2005-296737 A | 10/2005 |
| JP | 2006-210038 A | 8/2006 |
| JP | 2006-275433 A | 10/2006 |
| JP | 2007-047293 A | 2/2007 |
| JP | 2007-186740 A | 7/2007 |
| JP | 2008-108628 A | 5/2008 |
| JP | 2008-121098 A | 5/2008 |
| JP | 2008-521165 A | 6/2008 |
| JP | 2009-019243 A | 1/2009 |
| JP | 2009-87910 A | 4/2009 |
| KR | 10-0257219 B1 | 2/2000 |
| KR | 10-2000-0019254 A | 4/2000 |
| KR | 10-2000-0023929 A | 5/2000 |
| KR | 10-2001-0024652 A | 3/2001 |
| KR | 10-2001-0059939 A | 7/2001 |
| KR | 20-0257218 Y1 | 11/2001 |
| KR | 10-2002-0000201 A | 1/2002 |
| KR | 10-2002-0001555 A | 1/2002 |
| KR | 10-2012-0022135 A | 3/2002 |
| KR | 10-2002-0050922 A | 6/2002 |
| KR | 10-2002-0090934 A | 12/2002 |
| KR | 10-2003-0001745 A | 1/2003 |
| KR | 10-2003-0046090 A | 6/2003 |
| KR | 2003-0069684 A | 8/2003 |
| KR | 10-0405080 B1 | 11/2003 |
| KR | 10-2003-0091947 A | 12/2003 |
| KR | 10-2003-0093959 A | 12/2003 |
| KR | 10-2004-0034537 A | 4/2004 |
| KR | 10-2004-0050045 A | 6/2004 |
| KR | 10-2004-0069281 A | 8/2004 |
| KR | 10-2004-0084747 A | 10/2004 |
| KR | 10-0463212 B1 | 12/2004 |
| KR | 10-2005-0062853 A | 6/2005 |
| KR | 10-0520159 B1 | 10/2005 |
| KR | 10-2006-0008602 A | 1/2006 |
| KR | 10-2006-0018745 A | 3/2006 |
| KR | 10-2006-0020050 A | 3/2006 |
| KR | 10-2006-0049050 A | 5/2006 |
| KR | 10-2006-0056706 A | 5/2006 |
| KR | 10-2006-0058459 A | 5/2006 |
| KR | 10-2006-0059068 A | 6/2006 |
| KR | 10-2006-0065978 A | 6/2006 |
| KR | 10-2006-0073367 A | 6/2006 |
| KR | 10-2006-0080475 A | 7/2006 |
| KR | 10-2006-0080481 A | 7/2006 |
| KR | 10-2006-0080482 A | 7/2006 |
| KR | 10-2006-0083510 A | 7/2006 |
| KR | 10-2006-0092387 A | 8/2006 |
| KR | 10-2006-0098755 A | 9/2006 |
| KR | 10-0627110 B1 | 9/2006 |
| KR | 10-2006-0104675 A | 10/2006 |
| KR | 10-2006-0104677 A | 10/2006 |
| KR | 10-2006-0109627 A | 10/2006 |
| KR | 10-0635903 B1 | 10/2006 |
| KR | 10-0645719 B1 | 11/2006 |
| KR | 10-0646160 B1 | 11/2006 |
| KR | 10-0687007 B1 | 2/2007 |
| KR | 10-2007-0025164 A | 3/2007 |
| KR | 10-0696547 B1 | 3/2007 |
| KR | 10-0697663 B1 | 3/2007 |
| KR | 10-0698033 B1 | 3/2007 |
| KR | 10-0700466 B1 | 3/2007 |
| KR | 10-2007-0035796 A | 4/2007 |
| KR | 10-0711885 B1 | 4/2007 |
| KR | 10-2007-0050793 A | 5/2007 |
| KR | 10-0723627 B1 | 6/2007 |

(56) References Cited

FOREIGN PATENT DOCUMENTS

| | | |
|---|---|---|
| KR | 10-0726132 B1 | 6/2007 |
| KR | 10-0739309 B1 | 7/2007 |
| KR | 10-2007-0078713 A | 8/2007 |
| KR | 10-2007-0080635 A | 8/2007 |
| KR | 10-2007-0101842 A | 10/2007 |
| KR | 10-2007-0105595 A | 10/2007 |
| KR | 10-0768212 B1 | 10/2007 |
| KR | 10-0770653 B1 | 10/2007 |
| KR | 10-2007-0112668 A | 11/2007 |
| KR | 10-2008-0001184 A | 1/2008 |
| KR | 10-0797787 B1 | 1/2008 |
| KR | 10-0800125 B1 | 1/2008 |
| KR | 10-0815265 B1 | 3/2008 |
| KR | 10-0823508 B1 | 4/2008 |
| KR | 10-2008-0044775 A | 5/2008 |
| KR | 10-0827760 B1 | 5/2008 |
| KR | 10-2008-0048653 B1 | 6/2008 |
| KR | 10-0839380 B1 | 6/2008 |
| KR | 10-2008-0060400 A | 7/2008 |
| KR | 10-2008-0061132 A | 7/2008 |
| KR | 10-2008-0062212 A | 7/2008 |
| KR | 10-0863901 B1 | 10/2008 |
| KR | 10-2008-0109559 A | 12/2008 |
| KR | 10-2009-0038733 A | 4/2009 |
| KR | 10-2009-0040618 A | 4/2009 |
| KR | 10-2009-0052155 A | 5/2009 |
| KR | 10-2009-0053417 A | 5/2009 |
| KR | 10-0908232 B1 | 7/2009 |
| KR | 10-2009-0093161 A | 9/2009 |
| KR | 10-2009-0097453 A | 9/2009 |
| KR | 10-2010-0000128 A | 1/2010 |
| KR | 10-2010-0000129 A | 1/2010 |
| KR | 10-2010-0026655 A | 3/2010 |
| KR | 10-2010-0047796 A | 5/2010 |
| KR | 10-2010-0090070 A | 8/2010 |
| KR | 10-2011-010767 A | 9/2011 |
| WO | WO 99/25894 | 5/1999 |

OTHER PUBLICATIONS

Machine English Translation for JP-2003-003250 A, dated Jan. 8, 2003 listed above.
Machine English Translation for JP-2004-349101 A, dated Dec. 9, 2004, listed above.
Japanese Office Action, dated Aug. 21, 2012, corresponding to JP 2010-145075.
Japanese Office Action, dated Sep. 4, 2012, corresponding to JP 2010-152846.
Korean Office Notice of Allowance, dated Sep. 1, 2012, corresponding to KR 10-2010-0013848.
Korean Office Notice of Allowance, dated Sep. 1, 2012, corresponding to KR 10-2010-0009160.
Korean Office Action, dated Sep. 1, 2012, corresponding to KR 10-2010-0010136.
Korean Office Action, dated Feb. 1, 2012, corresponding to KR 10-2010-0011196.
Korean Office Action, dated Feb. 1, 2012, corresponding to KR 10-2010-0013848.
Korean Office Action, dated Jan. 13, 2012, for Korean Patent application 10-2009-0056529.
Korean Office Notice of Allowance, dated Apr. 30, 2012, for Korean Patent application 10-2010-0066992.
Korean Office Notice of Allowance, dated Jul. 20, 2012, for Korean Patent application 10-2010-0003545.
Korean Office Notice of Allowance, dated Sep. 28, 2012, for Korean Patent application 10-2009-0052357.
Korean Office Notice of Allowance, dated Nov. 25, 2012, for Korean Patent application 10-2010-0014277.
Korean Patent Abstract, Publication No. 10-0252719 B1 A, dated Feb. 29, 2000 for corresponding Korean Patent 10-1997-0054303 listed above.
Korean Patent Abstract, Publication No. 10-2002-0086047 A, dated Nov. 18, 2002 for corresponding Korean Patent 10-0405080 listed above.
Korean Patent Abstract, Publication No. 10-2002-0088662 A, dated Nov. 29, 2002 for corresponding Korean Patent 10-0463212 listed above.
Korean Patent Abstract, Publication No. 10-2005-0045619 A, dated May 17, 2005 for corresponding Korean Patent 10-0520159 listed above.
Korean Patent Abstract, Publication No. 10-2004-0062203 A, dated Jul. 7, 2004 for corresponding Korean Patent 10-0646160 listed above.
Korean Patent Abstract, Publication No. 10-2006-0101987 A, dated Sep. 27, 2006 for corresponding Korean Patent 10-0687007 listed above.
Korean Patent Abstract, Publication No. 10-2002-0056238 A, dated Jul. 10, 2002 for corresponding Korean Patent 10-0698033 listed above.
Korean Patent Abstract, Publication No. 10-2005-0078637 A, dated Aug. 5, 2005 for corresponding Korean Patent 10-0700466 listed above.
Korean Patent Abstract, Publication No. 10-2007-0025164 A, dated Mar. 8, 2007 for corresponding Korean Patent 10-0711885 listed above.
Korean Patent Abstract, Publication No. 10-2002-0034272 A, dated May 9, 2002 for corresponding Korean Patent 10-0726132 listed above.
Korean Patent Abstract, Publication No. 10-2006-0126267 A, dated Dec. 7, 2006 for corresponding Korean Patent 10-0797787 listed above.
Korean Patent Abstract, Publication No. 2008-0002189 A, dated Jan. 4, 2008 for corresponding Korean Patent 10-0800125 listed above.
Korean Patent Abstract, Publication No. 10-2007-0050793 A, dated May 16, 2007 for corresponding Korean Patent 10-0815265 listed above.
Korean Patent Abstract, Publication No. 10-2001-0062735 A, dated Jul. 7, 2001 for corresponding Korean Patent 10-0827760 listed above.
Korean Patent Abstract, Publication No. 10-2008-0038650 A, dated Jul. 5, 2008 for corresponding Korean Patent 10-0839380 listed above.
Korean Patent Abstract, Publication No. 10-2007-0097218 A, dated Oct. 4, 2007 for corresponding Korean Patent 10-0768212 listed above.
Korean Patent Abstract, Publication No. 10-2005-0114514 A, dated Dec. 6, 2005 for corresponding Korean Patent 10-0627110 listed above.
U.S. Notice of Allowance, dated Mar. 18, 2013, corresponding to U.S. Appl. No. 12/795,001.
U.S. Office action dated Dec. 20, 2012, corresponding to U.S. Appl. No. 12/984,289.
U.S. Office action dated Feb. 26, 2013, corresponding to U.S. Appl. No. 12/794,093.
U.S. Office action dated Mar. 15, 2013, corresponding to U.S. Appl. No. 12/813,786.
U.S. Office action dated Mar. 18, 2013, corresponding to U.S. Appl. No. 12/984,231.
U.S. Office action dated Mar. 19, 2013, corresponding to U.S. Appl. No. 12/194,759.
U.S. Office action dated Mar. 22, 2013, corresponding to U.S. Appl. No. 12/987,569.
U.S. Office action dated May 7, 2013, corresponding to U.S. Appl. No. 12/820,270.
U.S. Office action dated Jun. 11, 2013, corresponding to U.S. Appl. No. 12/862,125.
U.S. Office action dated Jun. 26, 2013, corresponding to U.S. Appl. No. 12/794,093.
U.S. Office action dated Jul. 17, 2013, corresponding to U.S. Appl. No. 12/984,231.
U.S. Office action dated Aug. 13, 2013, corresponding to U.S. Appl. No. 13/194,759.

* cited by examiner

METHOD OF MANUFACTURING ORGANIC LIGHT-EMITTING DISPLAY APPARATUS

CROSS-REFERENCE TO RELATED APPLICATION

This application claims priority to and the benefit of Korean Patent Application No. 10-2013-0043025, filed on Apr. 18, 2013, in the Korean Intellectual Property Office, the entire content of which is incorporated herein by reference.

BACKGROUND

1. Field

One or more aspects of the present invention relate to a patterning slit sheet, a deposition apparatus including the same, a method of manufacturing an organic light-emitting display apparatus using the same, an organic light-emitting display apparatus manufactured by using the method.

2. Description of the Related Art

Organic light-emitting display apparatuses have a larger viewing angle, better contrast characteristics, and a faster response rate than other display devices, and thus have drawn attention as the next-generation display devices.

An organic light-emitting display device includes an intermediate layer, which includes an organic emission layer, between a first electrode and a second electrode that are arranged opposite to each other. Here, the first and second electrodes and the intermediate layer may be formed via various methods, one of which is a deposition method. In order to manufacture an organic light-emitting display apparatus by using a deposition method, an intermediate layer having a set or predetermined pattern is formed by adhering a fine metal mask (FMM), which has openings of the same/similar pattern with the pattern of the intermediate layer that is to be formed on a substrate, to the substrate and by depositing a material of the intermediate layer through the FMM.

SUMMARY

However, a conventional mask that is used in the deposition method does not have a good durability. That is, an opening of the same/similar pattern with a pattern of an intermediate layer that is to be formed on a substrate is formed in a sheet of the mask, and thus an intermediate layer having a different pattern from the desired pattern may be formed on the substrate because a shape of the opening may be deformed (modified) as the mask is being used.

One or more aspects of the present invention are directed toward a patterning slit sheet through which a slit area is appropriately secured while preventing deformation (modification) of the patterning slits in the slit area, a deposition apparatus including the same, a method of manufacturing an organic light-emitting display apparatus using the same, an organic light-emitting display apparatus manufactured by using the method. However, the scope of the present invention is not limited thereto.

According to an embodiment of the present invention, a patterning slit sheet includes:

a sheet including:

a slit area having a plurality of patterning slits that are extended along a first direction and arranged along a second direction crossing the first direction;

a first dummy slit area being outside the slit area in the second direction and having a plurality of dummy slits that are extended along the first direction and arranged along the second direction;

a second dummy slit area being outside the slit area in an opposite direction of the second direction and having a plurality of dummy slits that are extended along the first direction and arranged along the second direction; and a binding area surrounding the slit area, the first dummy slit area, and the second dummy slit area; and a frame that is attached to the binding area of the sheet and configured to shield at least some of the plurality of dummy slits of the first dummy slit area and the second dummy slit area.

The frame may be configured to completely shield the dummy slits most adjacent to the binding area among the plurality of dummy slits of the first dummy slit area and the second dummy slit area of the sheet.

According to another embodiment of the present invention, a patterning slit sheet includes:

a sheet including:

a slit area having a plurality of patterning slits that are extended along a first direction and arranged along a second direction crossing the first direction;

a first dummy slit area being outside the slit area in the second direction and having a plurality of dummy slits that are extended along the first direction and arranged along the second direction;

a second dummy slit area being outside the slit area in an opposite direction of the second direction and having a plurality of dummy slits that are extended along the first direction and arranged along the second direction; and a binding area surrounding the slit area, the first dummy slit area, and the second dummy slit area;

a frame that is attached to the binding area of the sheet; and a prop unit that is attached to the frame and configured to shield at least some of the plurality of dummy slits of the first dummy slit area and the second dummy slit area of the sheet.

The prop unit may include a first prop configured to shield at least some of the plurality of dummy slits of the first dummy slit area, and a second prop configured to shield at least some of the plurality of dummy slits of the second dummy slit area.

The first prop and the second prop may be extended along the first direction.

A length of the first prop and the second prop extended in the first direction may be equal to a length of the slit area in the first direction.

The first prop may be in contact with the first dummy slit area of the sheet, and the second prop is in contact with the second dummy slit area of the sheet.

The prop unit may be detachably attached to the frame.

The first prop may be configured to completely shield a dummy slit most adjacent to the binding area among the plurality of dummy slits of the first dummy slit area, and the second prop may be configured to completely shield a dummy slit most adjacent to the binding area among the plurality of dummy slits of the second dummy slit area.

The binding area of the sheet may be attached to the frame by welding.

According to another embodiment of the present invention, a deposition apparatus includes:

a transport unit that includes a first transport unit and a second transport unit, wherein the first transport unit is configured to transport, in one direction, a moving unit to which a substrate is detachably fixed, wherein the second transport unit is configured to transport, in an opposite direction of the one direction, the moving unit from which the substrate is separated, so that the moving unit is cyclically transported by the first transport unit and the second transport unit; and a deposition unit that includes at least one deposition assembly and a chamber, wherein the deposition assembly is spaced apart from the substrate at a set or predetermined interval and configured to deposit a deposition material on the substrate while the first transport unit transports the substrate fixed to the moving unit, wherein the at least one deposition assembly includes:

a deposition source configured to evaporate (radiate) the deposition material;

a nozzle unit that is disposed toward the first transport unit from the deposition source and includes a deposition source nozzle; and the patterning slit sheet described above that is disposed facing the deposition nozzle unit.

The first direction along which the plurality of patterning slits of the sheet may be extended is the same direction as the one direction in which the first transport unit transports the substrate fixed to the moving unit.

According to another embodiment of the present invention, a deposition apparatus includes:

a transport unit that includes a first transport unit and a second transport unit, wherein the first transport unit is configured to transport, in one direction, a moving unit to which a substrate is detachably fixed, wherein the second transport unit is configured to transport, in an opposite direction of the one direction, the moving unit from which the substrate is separated, so that the moving unit is cyclically transported by the first transport unit and the second transport unit; and a deposition unit that includes at least one deposition assembly and a chamber, wherein the deposition assembly is spaced apart from the substrate at a set or predetermined interval and configured to deposit a deposition material on the substrate while the first transport unit transports the substrate fixed to the moving unit, wherein the deposition assembly includes:

a deposition source configured to radiate the deposition material;

a nozzle unit that is disposed toward the first transport unit from the deposition source and includes a deposition source nozzle; and the patterning slit sheet described above that is disposed facing the deposition nozzle unit.

The first direction along which the plurality of patterning slits of the sheet are extended is the same direction as the one direction in which the first transport unit transports the substrate fixed to the moving unit.

According to another embodiment of the present invention, a method of manufacturing an organic light-emitting apparatus includes:

transporting a moving unit to which a substrate is fixed to a chamber by using a first transport unit;

forming a layer by depositing a deposition material discharged from a deposition assembly while relatively transporting the substrate with respect to the deposition assembly by using the first transport unit while the deposition assembly and the substrate disposed in the chamber are spaced apart at a set or predetermined interval; and returning the moving unit from which the substrate is separated back by using a second transport unit that is configured to penetrate the chamber, wherein the deposition assembly includes a deposition source configured to evaporate the deposition material, a nozzle unit disposed to face toward the first transport unit and having a deposition source nozzle, and a patterning slit sheet facing the deposition nozzle unit and having a sheet and a frame attached to the sheet, wherein the sheet includes a slit area, a first dummy slit area, a second dummy slit area, and a binding area, wherein the slit area has a plurality of patterning slits that are extended along a first direction and arranged along a second direction crossing the first direction, wherein the first dummy slit area is outside the slit area in the second direction and has a plurality of dummy slits that are extended along the first direction and arranged along the second direction, wherein the second dummy slit area is outside the slit area in an opposite direction of the second direction and has a plurality of dummy slits that are extended along the first direction and arranged along the second direction, wherein the binding area surrounds the slit area, the first dummy slit area, and the second dummy slit area;

wherein the forming of the layer includes forming of a layer while the frame is attached to the binding area of the sheet and configured to shield at least some of the plurality of the dummy slits of the first dummy slit area and the second dummy slit area of the sheet.

The forming of the layer may include forming of a layer while the frame is configured to completely shield the plurality of dummy slits most adjacent to the binding area among the plurality of dummy slits of the first dummy slit area and the second dummy slit area of the sheet.

According to another embodiment of the present invention, a method of manufacturing an organic light-emitting apparatus includes:

transporting a moving unit to which a substrate is fixed to a chamber by using a first transport unit;

forming a layer by depositing a deposition material discharged from a deposition assembly while relatively transporting the substrate with respect to the deposition assembly by using the first transport unit while the deposition assembly and the substrate disposed in the chamber are distanced apart at a set or predetermined interval; and returning the moving unit from which the substrate is separated back by using the second transport unit that is configured to penetrate the chamber;

wherein the deposition assembly includes a deposition source configured to evaporate the deposition material, a nozzle unit disposed to face toward the first transport unit and having a deposition source nozzle, and a patterning slit sheet facing the deposition nozzle unit and having a sheet, a frame attached to the sheet, and a prop unit attached to the frame, wherein the sheet includes a slit area, a first dummy slit area, a second dummy slit area, and a binding area, wherein the slit area has a plurality of patterning slits that are extended along a first direction and arranged along a second direction crossing the first direction, wherein the first dummy slit area is outside the slit area in the second direction and has a plurality of dummy slits that are extended along the first direction and arranged along the second direction, wherein the second dummy slit area is outside the slit area in an opposite direction of the second direction and has a plurality of dummy slits that are extended along the first direction and arranged along the second direction, wherein the binding area surrounds the slit area, the first dummy slit area, and the second dummy slit area;

wherein the forming of the layer includes forming of a layer while the frame is attached to the binding area of the sheet, and the prop unit is configured to shield at least some of the plurality of dummy slits of the first dummy slit area and the second dummy slit area of the sheet.

The prop unit may include a first prop and a second prop, wherein the forming of the layer includes forming a layer while the first prop is configured to shield at least one dummy slit among the plurality of dummy slits of the first dummy slit area of the sheet, and the second prop is configured to shield at least one dummy slit among the plurality of dummy slits of the second dummy slit area of the sheet.

The first prop and the second prop may be extended along the first direction.

A length of the first prop and the second prop extended in the first direction may be equal to a length of the slit area of the sheet in the first direction.

The first prop may be in contact with the first dummy slit area of the sheet, and the second prop may be in contact with the second dummy slit area of the sheet.

The first prop may be configured to completely shield a dummy slit most adjacent to the binding area among the plurality of dummy slits of the first dummy slit area, and the second prop may be configured to completely shield a dummy slit most adjacent to the binding area among the plurality of dummy slits of the second dummy slit area.

According to another embodiment of the present invention, an organic light-emitting display apparatus includes:
 a substrate;
 a plurality of thin film transistors on the substrate;
 a plurality of pixel electrodes electrically connected to the plurality of thin film transistors;
 a plurality of deposition layers on the plurality of pixel electrodes; and
 counter electrodes disposed on the deposition layers,
 wherein at least one of the plurality of deposition layers has a linear pattern that is formed by using the deposition apparatus described above.

According to another embodiment of the present invention, an organic light-emitting display apparatus includes:
 a substrate;
 a plurality of thin film transistors on the substrate;
 a plurality of pixel electrodes electrically connected to the plurality of thin film transistors;
 a plurality of deposition layers on the plurality of pixel electrodes; and
 counter electrodes disposed on the deposition layers,
 wherein at least one of the plurality of deposition layers has a linear pattern that is formed by using the deposition apparatus described above.

BRIEF DESCRIPTION OF THE DRAWINGS

The above and other features and enhancements of the present invention will become more apparent by describing in more detail some example embodiments thereof with reference to the attached drawings in which.

DETAILED DESCRIPTION

Figure 1:
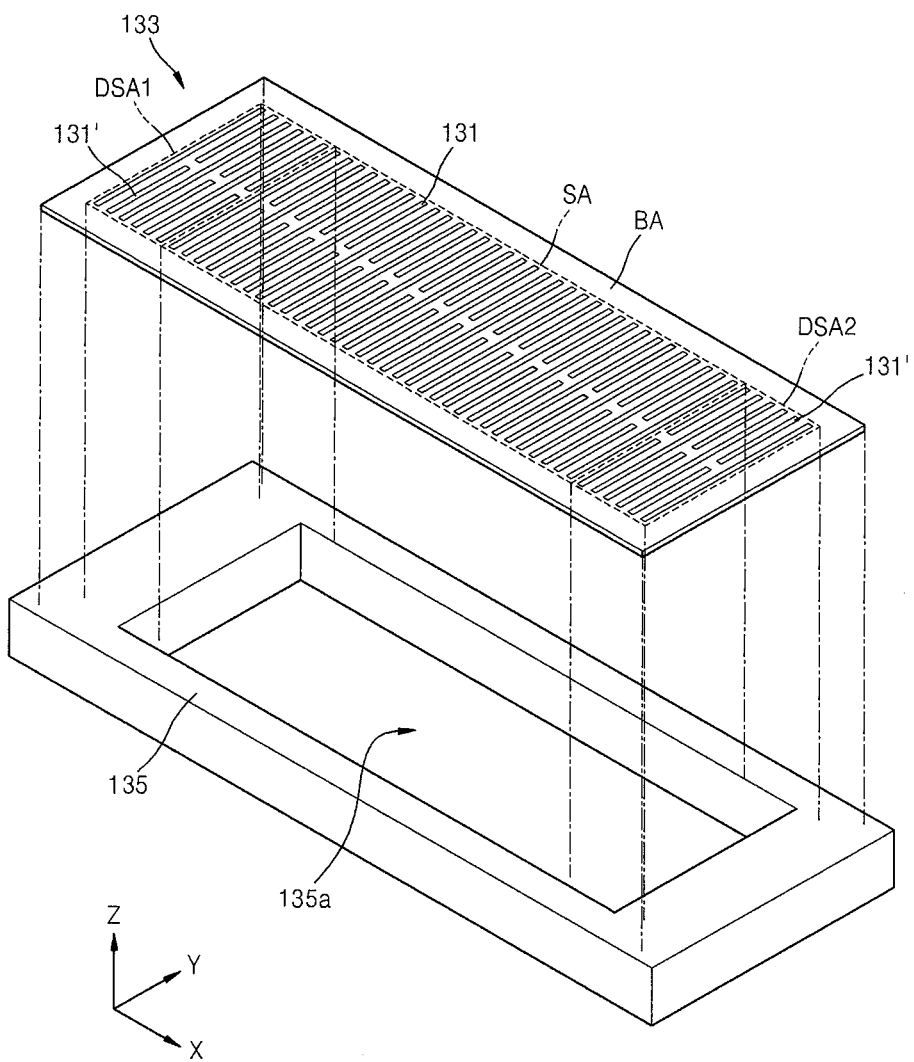
FIG. 1 is a schematic exploded perspective view illustrating a patterning slit sheet according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

Aspects of the present invention will now be described more fully with reference to the accompanying drawings, in which some example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Also, in the drawings, sizes of elements may be exaggerated or reduced for convenience in explanation. For example, a size and a thickness of each of the elements shown in the drawings are arbitrarily shown, and thus embodiments of the present invention are not necessarily limited to the drawings.

In the following embodiments, x-axis, y-axis, and z-axis may be understood as three axes on an orthogonal coordinate system, but are not limited thereto. For example, x-axis, y-axis, and z-axis may be orthogonal to one another but may indicate other directions that are not orthogonal to one another.

Meanwhile, it will be understood that when any element, such as a layer, an area, or a plate, is referred to as being "on" another element, the element can be "directly on" another element or intervening elements may be present.

Figure 2:
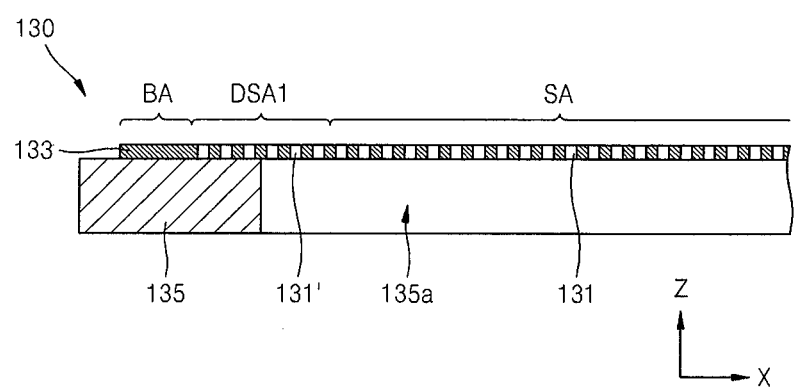
FIG. 2 is a schematic cross-sectional view illustrating a part of the patterning slit sheet of FIG. 1.

FIG. 1 is a schematic exploded perspective view illustrating a patterning slit sheet according to an embodiment of the present invention. FIG. 2 is a schematic cross-sectional view illustrating a part of the patterning slit sheet of FIG. 1.

A patterning slit sheet 130 includes a sheet 133 and a frame 135 that is attached to the sheet 133, wherein the sheet 133 has a slit area SA, a first dummy slit area DSA1, a second dummy slit area DSA2, and a binding area BA.

As shown in FIG. 1, the sheet 133 may have a length in a second direction (−X direction) intersecting with or crossing a first direction that is longer than a length in the first direction (+Y direction). As will be described later, this is because a deposition material is deposited on a substrate in a scanning manner as the substrate is being transferred while spaced apart from the patterning slit sheet 130 at a set or predetermined interval, rather than the patterning slit sheet 130 corresponds to an entire surface of the substrate on which a deposition material is to be deposited, as in a comparable process. Thus, when the substrate is transferred in the first direction, the length of the patterning slit sheet 130 in the first direction does not have to correspond with the length of the substrate in the first direction and thus may be much shorter than the length of the substrate in the first direction. Therefore, the sheet may have a length in the second direction (−X direction) intersecting with or crossing the first direction that is longer than a length in the first direction (+Y direction).

The sheet 133 may be manufactured by using a comparable fine metal mask (FMM) and, particularly, an etching process, which is used in a method of manufacturing a stripe mask.

The slit area SA of the sheet 133 is extended along the first direction (+Y direction) and has a plurality of patterning slits 131 that are arranged along the second direction (−X direction). In FIG. 1, the patterning slits 131 with different lengths in the first direction are alternately arranged and extended along the first direction, but the present invention is not limited thereto. For example, the patterning slits 131 having the same lengths in the first direction may be arranged in parallel along the second direction. The slit area SA allows a deposition material to pass through the plurality of patterning slits 131 to be deposited on a substrate in a set or predetermined pattern during a deposition process.

The first dummy slit area DSA1 of the sheet 133 is outside the slit area SA in the second direction (−X direction). The first dummy slit area DSA1 has a plurality of dummy slits 131' that are extended along the first direction (+Y direction) and arranged along the second direction. Similarly, the second dummy slit area DSA2 of the sheet 133 is outside the slit area SA in an opposite direction (+X direction) of the second direction (−X direction). Also, the second dummy slit area DSA2 has a plurality of dummy slits 131' that are extended along the first direction and arranged along the second direction. The plurality of dummy slits of the first dummy slit area DSA1 and the second dummy slit area DSA2 will be described later in more detail.

The binding area BA of the sheet 133 may have a shape that surrounds the slit area SA, the first dummy slit area DSA1, and the second dummy slit area DSA2 therein. The binding area BA, consequently, may be understood as indicating a part other than the slit area SA, the first dummy slit area DSA1, and the second dummy slit area DSA2 of the sheet 133.

The frame 135 has a shape that is approximately the same as a window frame and has an opening 135a therein. The opening 135a allows a deposition material to pass therethrough, to further pass through the plurality of patterning slits 131 of the slit area SA of the sheet 133, and to be deposited on a substrate.

The frame 135 is attached to the sheet 133, and particularly to the binding area BA of the sheet 133. The attaching of the frame 135 and the sheet 133 may be performed by, for example, welding. When the frame 135 is attached to the sheet 133, the frame 135 shields at least some of the plurality of dummy slits 131' of the first dummy slit area DSA1 and the second dummy slit area DSA2 of the sheet 133 when attached to the binding area BA of the sheet 133.

Because the sheet 133 has a length in a second direction (−X direction) intersecting with or crossing a first direction that is longer than a length in the first direction (+Y direction) as described above, the frame 135 and the sheet 133 are attached to each other while tensile forces are applied to the sheet 133 in the second direction (−X direction) and the opposite second direction (+X direction). If the frame 135 and the sheet 133 are attached to each other while tensile forces are not applied to the sheet 133 in the second direction (−X direction) and the opposite direction (+X direction) of the second direction, a center part of the sheet 133 may sag downwards (−Z direction) due to a self-weight of the sheet 133.

Here, when the frame 135 and the sheet 133 are attached to each other while tensile forces are applied to the sheet 133 in the second direction (−X direction) and the opposite direction (+X direction) of the second direction, shapes of the plurality of patterning slits 131 that are extended along the first direction (+Y direction) may be deformed (or modified). The deformation (modification) may be particularly apparent at an edge part in the second direction and an edge part in the opposite direction of the sheet 133.

However, in the case of the patterning slit sheet 130 according to an embodiment of the present invention, because the sheet 133 includes the first dummy slit area DSA1 and the second dummy slit area DSA2, and the first dummy slit area DSA1 and the second dummy slit area DSA2 include the plurality of dummy slits 131', deformation (modification) of shapes of the plurality of patterning slits 131 in the slit area SA located between the first dummy slit area DSA1 and the second dummy slit area DSA2 may be effectively prevented or reduced. That is, the first dummy slit area DSA1 and the second dummy slit area DSA2 exist on the edge part of the sheet 133 in the second direction and in the opposite direction of the second direction, respectively, and thus deformation (modification) of shapes of the plurality of patterning slits 131 in the slit area SA may be effectively prevented, reduced, or minimized even when shapes of at least some of the plurality of dummy slits 131' of the first dummy slit area DSA1 and the second dummy slit area DSA2 are modified or deformed.

Particularly, in the case of the patterning slit sheet 130 according to an embodiment of the present invention, the frame 135 shields at least some of the plurality of dummy slits 131' of the first dummy slit area DSA1 and the second dummy slit area DSA2 of the sheet 133. Here, some of the plurality of dummy slits 131' are on the frame 135. That is, some of the plurality of dummy slits 131' of the first dummy slit area DSA1 and the second dummy slit area DSA2 that are most adjacent to the binding area BA exist at least at the locations corresponding to the frame 135 and are being shielded by the frame 135.

The dummy slits 131' may be deformed (or modified) as described above, and as a result, shapes of the plurality of patterning slits 131 in the slit area SA may be deformed (or modified). Therefore, as the number of the dummy slits 131' located in the first dummy slit area DSA1 and the second dummy slit area DSA2 increases, a possibility of shape deformation (modification) of the plurality of the patterning slits 131 in the slit area SA may be lowered. However, in order to increase the number of the dummy slits 131' located in the first dummy slit area DSA1 and the second dummy slit area DSA2, an area occupied by the first dummy slit area DSA1 and the second dummy slit area DSA2 of the sheet 133 would be increased, which may narrow an area of the slit area SA where deposition is actually performed on a substrate.

Also, in the case of the patterning slit sheet 130 according to an embodiment of the present invention, at least a part of the first dummy slit area DSA1 and the second dummy slit area DSA2, as well as the binding area BA of the sheet 133, is attached to the frame 135. That is, at least a part of the first dummy slit area DSA1 and the second dummy slit area DSA2 is placed on the frame 135 while the rest of the first dummy slit area DSA1 and the second dummy slit area DSA2 is placed over the opening 135a of the frame 135. Consequently, an area of the first dummy slit area DSA1 and the second dummy slit area DSA2 may be increased without a reduction in an area of the slit area SA.

The number of the dummy slits 131' may be increased by forming, for example, three dummy slits 131' at a part corresponding to the frame 135, instead of only forming three dummy slits 131' in each of the first dummy slit area DSA1 and the second dummy slit area DSA2 corresponding to the opening 135a of the frame 135. In this regard, a shape stability of the plurality of patterning slits 131 of the slit area SA may be increased (e.g., remarkably increased).

Figure 3:
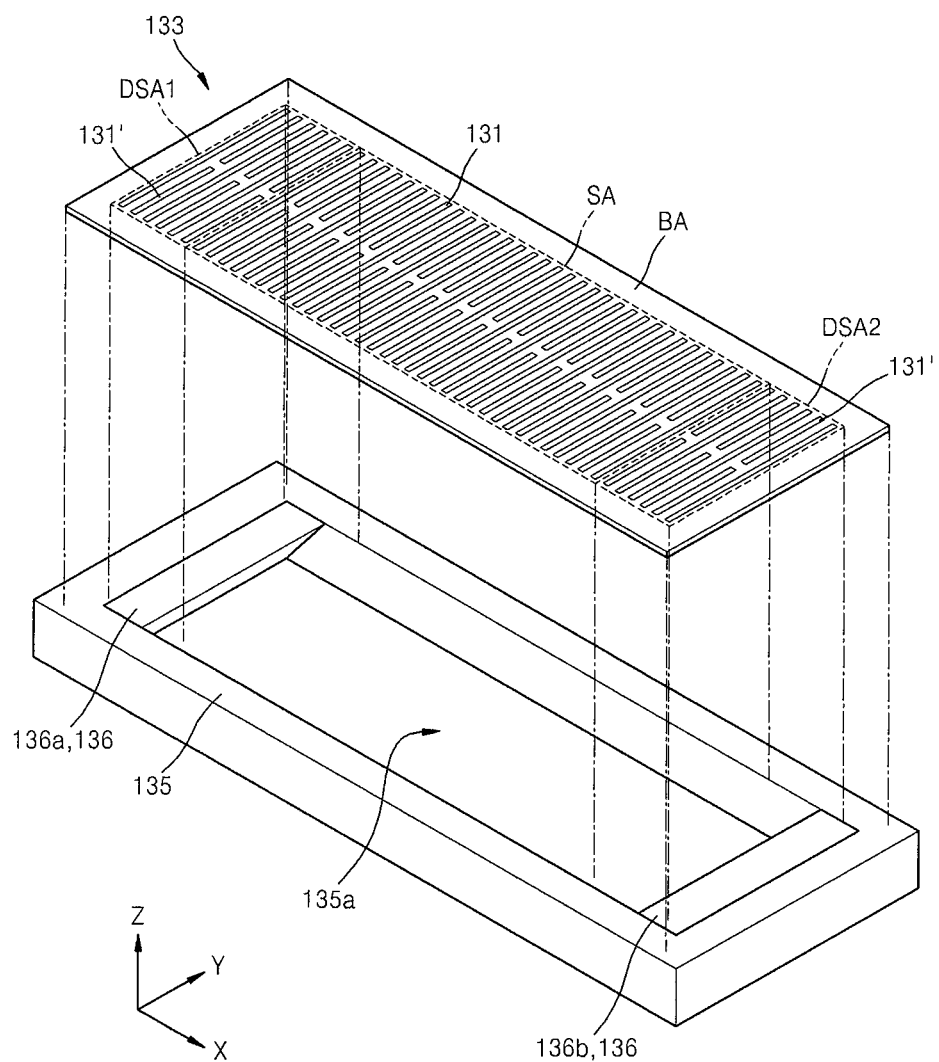
FIG. 3 is a schematic exploded perspective view illustrating a patterning slit sheet 130 according to another embodiment of the present invention.
Figure 4:
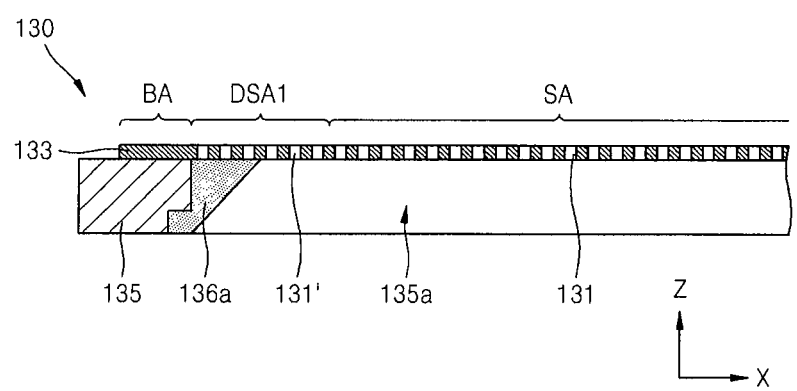
FIG. 4 is a schematic cross-sectional view illustrating a part of the patterning slit sheet of FIG. 3.

FIG. 3 is a schematic exploded perspective view illustrating a patterning slit sheet 130 according to another embodiment of the present invention. FIG. 4 is a schematic cross-sectional view illustrating a part of the patterning slit sheet of FIG. 3.

The patterning slit sheet 130 according to the current embodiment is different from the patterning slit sheet described above in that an opening 135*a* of a frame 135 corresponds to a first dummy slit area DSA1 and a second dummy slit area DSA2 as well as a slit area SA of a sheet 133. Also, the patterning slit sheet 130 according to the current embodiment further includes a prop unit 136.

The prop unit 136 may be attached to the frame 135 and may shield at least some of a plurality of dummy slits 131' of the first dummy slit area DSA1 and the second dummy slit area DSA2 of the sheet 133. In particular, the prop unit 136 may include a first prop 136*a* and a second prop 136*b*. The first prop 136*a* may shield at least some of the plurality of dummy slits 131' of the first dummy slit area DSA1 of the sheet 133, and the second prop 136*b* may shield at least some of the plurality of dummy slits 131' of the second dummy slit area DSA2 of the sheet 133.

As described above, a possibility of shape deformation (modification) of a plurality of patterning slits 131 of the slit area SA is lowered when the dummy slit 131' are deformed (modified), and thus a possibility of shape deformation (modification) of the plurality of patterning slits 131 in the slit area SA is lowered as the number of the dummy slits 131' located in the first dummy slit area DSA1 and the second dummy slit area DSA2 increases. However, in order to increase the number of dummy slits 131' located in the first dummy slit area DSA1 and the second dummy slit area DSA2, an area occupied by the first dummy slit area DSA1 and the second dummy slit area DSA2 of the sheet 133 needs to be increased. When an area occupied by the first dummy slit area DSA1 and the second dummy slit area DSA2 of the sheet 133 is increased, a distance between a binding area BA located in a second direction (−X direction) and a binding area BA located in the opposite direction (+X direction) based on the slit area SA of the sheet 133 may be increased as a result to maintain an area of the slit area SA the same. Therefore, a stability of the sheet 133 may be decreased.

Here, a stability of the sheet 133 refers to a high possibility of the sheet 133 sagging downwards (−Z direction) which may occur due to a self-weight of the sheet 133 as a distance between a binding area BA located in a second direction (−X direction) and a binding area BA located in the opposite direction (+X direction) based on the slit area SA of the sheet 133 increases.

However, the patterning slit sheet 130 according to the current embodiment further includes the prop unit 136 as stated above. The first prop 136*a* of the prop unit 136 is in contact with the first dummy slit area DSA1 of the sheet 133 and may shield at least some of the plurality of dummy slits 131' of the first dummy slit area DSA1. Also, the second prop 136*b* is in contact with the second dummy slit area DSA2 of the sheet 133 and may shield at least some of the plurality of dummy slits 131' of the second dummy slit area DSA2. Here, the first prop 136*a* completely shields the dummy slits 131' of the first dummy slit area DSA1 that are most adjacent to the binding area BA, and the second prop 136*b* completely shields the dummy slits 131' of the second dummy slit area DSA2 that are most adjacent to the binding area BA.

Because the prop unit 136 shields at least some of the plurality of dummy slits 131' while being in contact with the first dummy slit area DSA1 and the second dummy slit area DSA2, a decrease in stability of the sheet 133 may be effectively prevented or reduced as at least a part of the corresponding area is shielded and supported by the first prop 136*a* and the second prop 136*b* even when an area occupied by the first dummy slit area DSA1 and the second dummy slit area DSA2 of the sheet 133 is increased by increasing the number of the plurality of dummy slits 131'.

As shown in FIG. 3, the first prop 136*a* and the second prop 136*b* may be extended along a first direction (+Y direction). The first prop 136*a* and the second prop 136*b* are each extended along the first direction but may have a shape that is extended discontinuously. However, a stability of the sheet 133 may be further increased as the first prop 136*a* and the second prop 136*b* have a shape that is continuously extended along the first direction as shown in FIG. 3. When the first prop 136*a* and the second prop 136*b* have a shape that is continuously extended along the first direction as shown in FIG. 3, a length of the first prop 136*a* and the second prop 136*b* in the first direction may be the same as a length of the slit area SA of the sheet 133 in the first direction.

The prop unit 136 may be detachably attached to the frame 135 by bolts. As the prop unit 136 is detachably attached to the frame 135 by bolts, maintenance of the prop unit 136 may be facilitated.

The patterning slit sheet 130 has been described, but aspects of the present invention are not limited thereto, and a deposition apparatus including the patterning slit sheet 130 also belongs to a scope of the present invention.

Figure 5:
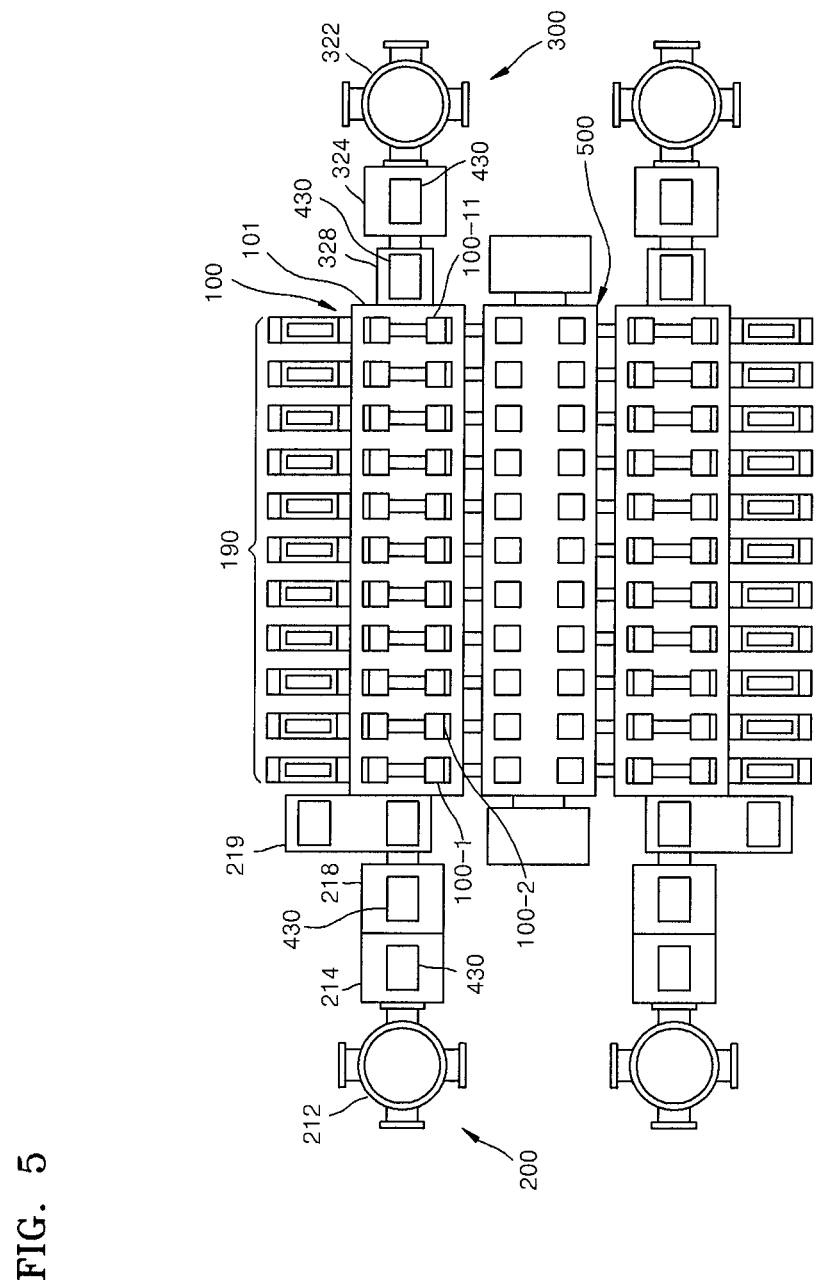
FIG. 5 is a schematic plan view illustrating a deposition apparatus according to another embodiment of the present invention.
Figure 6:
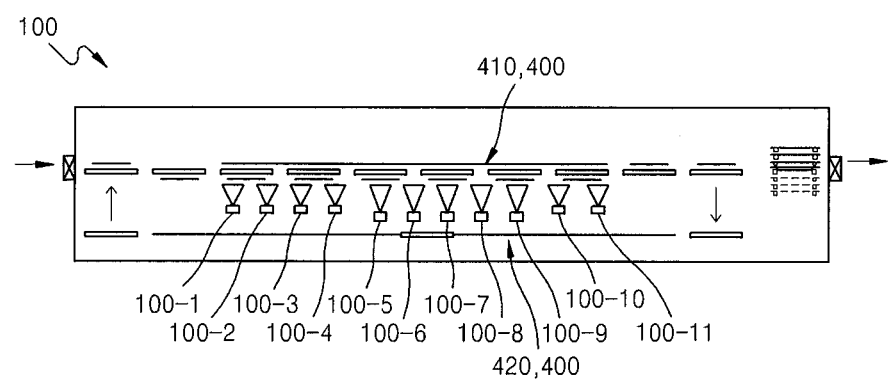
FIG. 6 is a schematic side view illustrating a deposition unit of the deposition apparatus of FIG. 5.

FIG. 5 is a schematic plan view illustrating a deposition apparatus according to another embodiment of the present invention. FIG. 6 is a schematic side view illustrating a deposition unit of the deposition apparatus of FIG. 5.

Referring to FIGS. 5 and 6, the deposition apparatus according to the embodiment of the present invention includes a deposition unit 100, a loading unit 200, an unloading unit 300, a transport unit 400, and a patterning slit sheet replacing unit 500. The transport unit 400 includes a first transport unit 410 capable of transporting a moving unit 430, to which a substrate 2 (see FIG. 7) is detachably fixed, in a first direction, and a second transport unit 420 capable of transporting the moving unit 430 from which the substrate 2 is separated in a reverse direction of the first direction.

The loading unit 200 may include a first rack 212, an introduction chamber 214, a first inversion chamber 218, and a buffer chamber 219.

A plurality of substrates 2 are loaded in the first rack 212 before performing deposition. An introduction robot picks up the substrate 2 from the first rack 212 and settles the substrate 2 to the moving unit 430 that is transported by the second transport unit 420 and located in the introduction chamber 214. The substrate 2 may be fixed in the moving unit 430 by clamps, and the moving unit 430 fixed with the substrate 2 is transferred to the first inversion chamber 218. If necessary, a process of aligning the substrate 2 with respect to the moving unit 430 may be performed before fixing the substrate 2 to the moving unit 430.

In the first inversion chamber 218 located adjacent to the introduction chamber 214, a first inversion robot inverts the moving unit 430. That is, the introduction robot places the substrate 2 on an upper surface of the moving unit 430, the moving unit 430 is transported to the first inversion chamber 218 while a surface of the substrate 2 opposite to a surface facing the moving unit 430 is facing upward, and the surface of the substrate 2 opposite to the surface facing the moving unit 430 faces downward as the first inversion robot inverts the first inversion chamber 218. Then, the first transport unit 410 transports the moving unit 430 to which the substrate 2 is fixed.

The unloading unit 300 may be constructed opposite to a structure of the loading unit 200 described above. That is, the substrate 2 and the moving unit 430 passed the deposition unit 100 are transported to an ejection chamber 324 after being inverted by a second inversion robot in a second inversion chamber 328. The substrate 2 is separated from the moving unit 430 in the ejection chamber 324, and the separated substrate 2 is loaded on a second rack 322 by an ejection robot. The second transport unit 420 transports the moving unit 430 from which the substrate 2 is separated back to the loading unit 200.

Embodiments of the present invention are not limited to the structure described above. The substrate 2 may be transported as it is fixed to a lower surface of the moving unit 430 if the substrate 2 is initially fixed to the moving unit 430. In this case, for example, the first inversion robot of the first inversion chamber 218 and the second inversion robot of the second inversion chamber 328 may be unnecessary. Also, the first inversion robot of the first inversion chamber 218 and the second inversion robot of the second inversion chamber 328 may only invert the moving unit 430 that is fixed to the substrate 2 in the first inversion chamber 218 or the second inversion chamber 328 rather than inverting the first inversion chamber 218 or the second inversion chamber 328. In this case, a transport unit in an inversion chamber may be rotated by 180 degrees while the moving unit 430 is located on the transport unit in the inversion chamber that may transport the moving unit 430 to which the substrate 2 is fixed. Also, in this case, the transport unit in the inversion chamber serves as the first inversion robot or the second inversion robot. Here, the transport unit in the inversion chamber may be a part of the first transport unit 410 or a part of the second transport unit 420.

The deposition unit 100 includes a chamber 101, and a plurality of deposition assemblies 100-1, 100-2, ... 100-11 may be disposed in the chamber 101 as shown in FIGS. 5 and 6. In FIG. 6, eleven deposition assemblies of a first deposition assembly 100-1 to an eleventh assembly 100-11 are shown as disposed in the chamber 101, but the number of deposition assemblies may vary according to a deposition material and a deposition condition. The chamber 101 may be maintained at a vacuum or a state close to vacuum while deposition is performed.

The first transport unit 410 transports the moving unit 430 fixed with the substrate 2 to at least the deposition unit 100, and, in one embodiment, transports sequentially to the loading unit 200, the deposition unit 100, and the unloading unit 300. The second transport unit 420 transports the moving unit 430, from which the substrate 2 is separated in the unloading unit 300, back to the loading unit 200. Accordingly, the moving unit 430 may be transported cyclically by the first transport unit 410 and the second transport unit 420.

The first transport unit 410 may be disposed to penetrate the chamber 101 when passing through the deposition unit 100, and the second transport unit 420 may be disposed to transport the moving unit 430 from which the substrate 2 is separated.

Here, the first transport unit 410 and the second transport unit 420 may be disposed vertically to each other. In this regard, deposition is performed on the substrate 2 while the moving unit 430 is transported by the first transport unit 410, and then the moving unit 430 is transported back to the loading unit 200 by the second transport unit 420 disposed below the first transport unit 410 after separating the moving unit 430 from the substrate 2 in the unloading unit 300, and thus an efficiency in using space may be improved. Unlike what is shown in FIGS. 5 and 6, the second transport unit 420 may be located above the first transport unit 410.

In addition, as shown in FIG. 5, the deposition unit 100 may include a deposition source replacement unit 190 that is disposed at one side of each of the deposition assemblies 100-1, 100-2, ... 100-11. Although not shown in the drawings, the deposition source replacement unit 190 is formed in a cassette shape and thus may be removed from the deposition assembly, for example, 100-1, to the outside. In this regard, replacing a deposition source (see 110 of FIG. 3) of the deposition assembly 100-1 may be facilitated.

In addition, two deposition apparatuses including the loading unit 200, the deposition unit 100, the unloading unit 300, and the transport unit 400 are arranged alongside in FIG. 5. In this case, a patterning slit sheet replacement unit 500 may be interposed between the two deposition apparatuses. That is, the two deposition apparatuses may share the patterning slit sheet replacement unit 500, and thus an efficiency in using space may be improved compared to the case when the patterning slit sheet replacement unit 500 is individually included in each of the deposition apparatuses.

Figure 7:
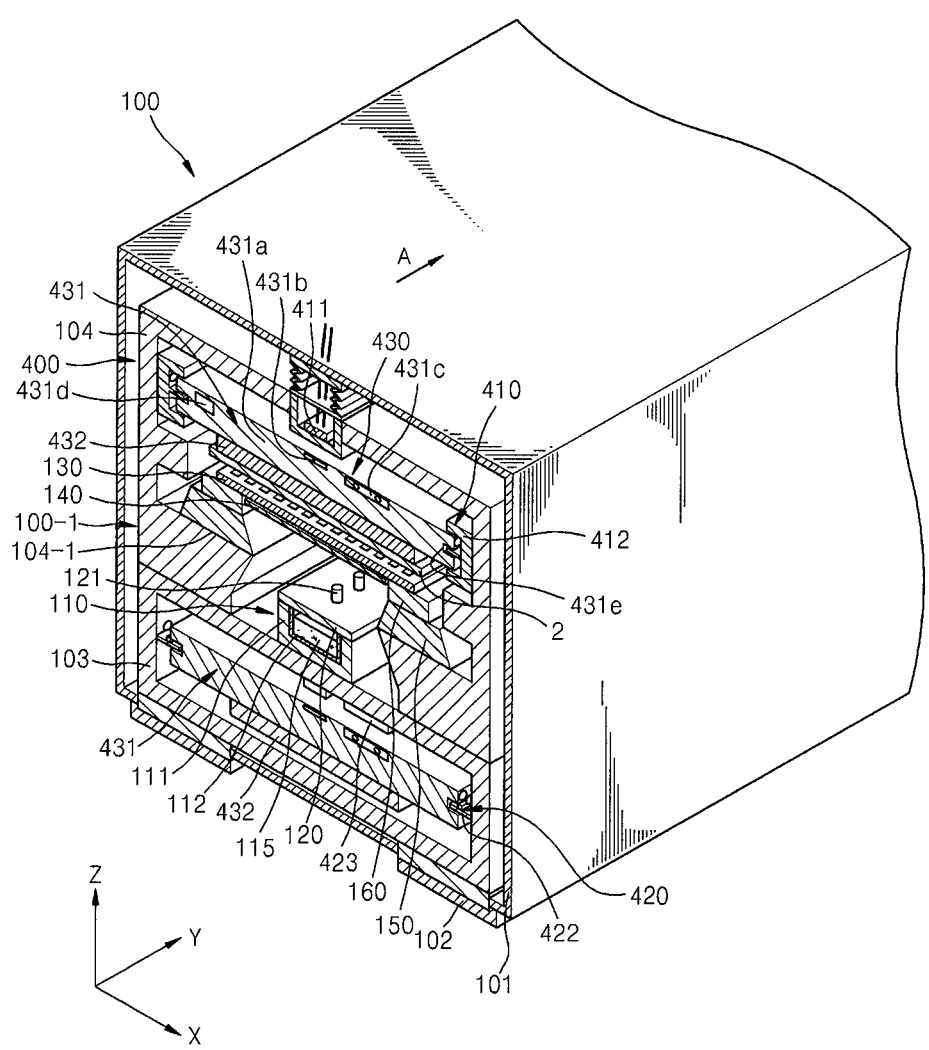
FIG. 7 is a schematic perspective cross-sectional view illustrating a part of the deposition unit of the deposition apparatus of FIG. 5.
Figure 8:
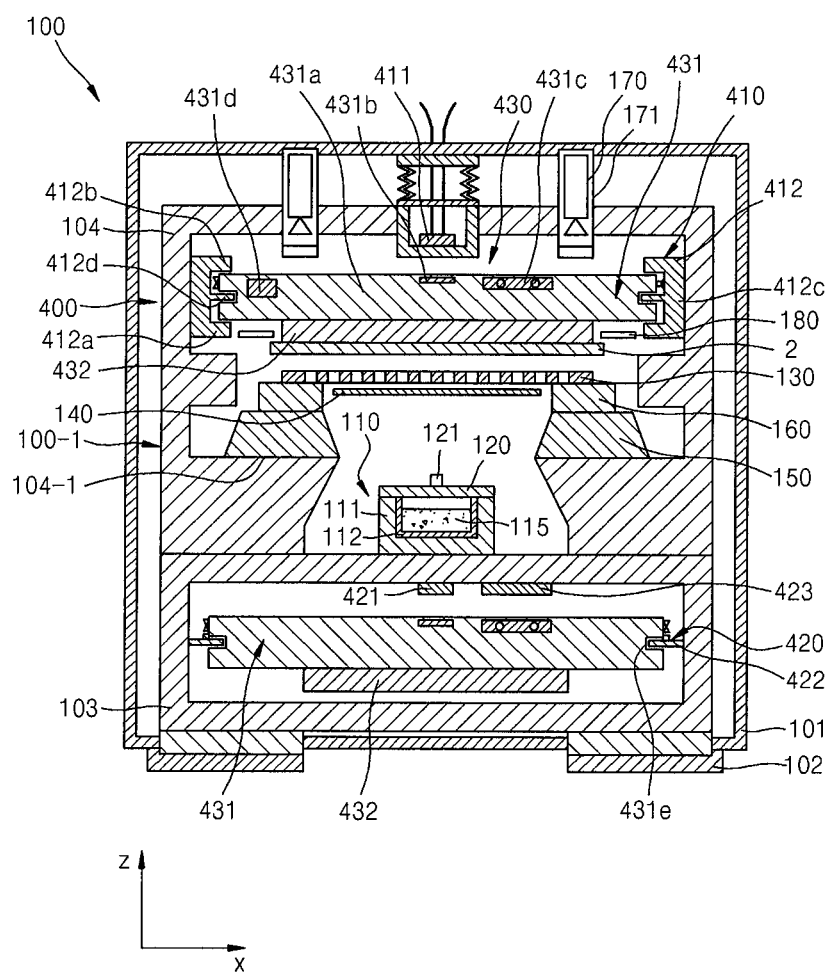
FIG. 8 is a schematic cross-sectional view illustrating a part of the deposition unit of the deposition apparatus of FIG. 5.

FIG. 7 is a schematic perspective cross-sectional view illustrating a part of the deposition unit of the deposition apparatus of FIG. 5. FIG. 8 is a schematic cross-sectional view illustrating a part of the deposition unit of the deposition apparatus of FIG. 5. Referring to FIGS. 7 and 8, a deposition unit 100 of a deposition apparatus according to the current embodiment includes a chamber 101 and at least one deposition assembly 100-1.

The chamber 101 is formed in a shape of an empty box and accommodates the at least one deposition assembly 100-1 in the empty space. As shown in the drawing, the transport unit 400 may also be accommodated in the chamber 101 or may be extended in and out of the chamber 101 in some aspects of the embodiment.

A lower housing 103 and an upper housing 104 may be accommodated in the chamber 101. In particular, the lower housing 103 is disposed on a foot 102 that may be fixed to the ground, and the upper housing 104 may be disposed on the lower housing 103. Here, a connection unit of the lower housing 103 and the chamber 101 is sealed, and thus inside of the chamber 101 may be completely blocked from the outside. In this regard, as the lower housing 103 and the upper housing 104 are disposed on the foot 102 that is fixed to the ground, the lower housing 103 and the upper housing 104 may maintain fixed locations even when the chamber 101 is repeatedly contracted and expanded, and thus the lower housing 103 and the upper housing 104 may serve as a reference frame in the deposition unit 100.

The deposition assembly 100-1 and a first transport unit 410 of a transport unit 400 may be disposed in the upper housing 104, and a second transport unit 420 of the transport unit 400 may be disposed in the lower housing 103. A moving unit 430 may be cyclically transported by the first transport unit 410 and the second transport unit 420 to continuously perform deposition on a substrate 2 that is fixed to the moving unit 430. In this regard, the moving unit 430, which is cyclically transported, may include an electrostatic chuck 432 and a carrier 431, wherein the substrate 2 may be fixed on one surface of the electrostatic chuck 432, and the carrier 431 is attached to the electrostatic chuck 432.

The carrier 431 may further include a main body unit 431a, a linear motor system (LMS) magnet rail 431b, a contactless power supply (CPS) module 431c, a power unit 431d, and a guide groove 431e. If necessary, the carrier 431 may further include a cam follower.

The main body unit 431a forms a base unit of the carrier 431 and may be formed of a magnetic substance, such as iron. The carrier 431 may be distanced apart from a guide unit 412 of the first transport part 410 at a set or predetermined distance due to attraction and repulsion forces between the main body unit 431a of the carrier 431 and a magnetic levitation bearing included in the first transport unit 410. Also, the guide groove 431e may be formed at each of both sides of the main body unit 431a. The guide groove 431e may accommodate a guide projection 412d of the guide unit 412 of the first transport unit 410 or a roller guide 422 of the second transport unit 420.

Moreover, the main body unit 431a may include a magnetic rail 431b that is arranged along a center line of a moving direction (a direction of Y-axis). The magnetic rail 431b of the main body unit 431a may form a linear motor together with a coil 411 of the first transport unit 410, and the carrier 431, with the moving unit 430, may be transported in an A direction by the linear motor. Accordingly, the moving unit 430 may be transported by a current supplied to the coil 411 of the first transport unit 410 even when power is not applied to the moving unit 430. In this regard, the plurality of coils 411 may be arranged at a constant interval in the chamber 101 (in a direction of Y-axis). The coils 411 are disposed in an atmosphere box, and thus may be mounted in air.

In addition, the main body unit 431a may include the CPS module 431c and the power unit 431d that are respectively disposed at one side and the other side of the magnetic rail 431b. The power unit 431d has a battery (e.g., a rechargeable battery) to provide power for the electrostatic chuck 432 to chuck the substrate 2 and maintain the chucking, and the CPS module 431c is a wireless charge module for charging the battery of the power unit 431d. A charging track 423 included in the second transport unit 420 is connected to an inverter. Therefore, a magnetic field is formed between the charging track 423 and the CPS module 431c when the second transport unit 420 transports the carrier 431 to provide electric power to the CPS module 431c, and thus the power unit 431d may be charged.

The electrostatic chuck 432 may include a main body formed of ceramic and an electrode embedded the main body, wherein power is applied to the electrode. The electrostatic chuck 432 allows the substrate 2 to be attached on a surface of the main body as a high voltage is applied to the electrode embedded in the main body from the power unit 431d inside the main body unit 431a of the carrier 431.

The first transport unit 410 has the same structure as described above and may transport the moving unit 430 to which the substrate 2 is fixed in a first direction (+Y direction). The first transport unit 410 has the coil 411 and the guide unit 412 that are the same ones as described above and may further include a magnetic levitation bearing or a gap sensor.

The coil 411 and the guide unit 412 may each be disposed on an inner surface of the upper housing 104. For example, the coil 411 may be disposed on the inner surface at an upper part of the upper housing 104, and the guide unit 412 may be disposed at each of both side of the inner surface of the upper housing 104.

The coil 411 may form a linear motor together with the magnetic rail 431b of the main body unit 431a of the moving unit 430 as described above and thus may allow the moving unit 430 to move. The guide unit 412 may guide the moving unit 430 to be transported in the first direction (a direction of Y-axis). The guide unit 412 may be disposed to penetrate through the deposition unit 100.

In particular, the guide unit 412 may accommodate both sides of the carrier 431 of the moving unit 430 and thus may guide the carrier 431 to move in the A direction of FIG. 7. In this regard, the guide unit 412 may have a first accommodation unit 412a disposed under the carrier 431, a second accommodation unit 412b disposed above the carrier 431, and a connection unit 412c connecting the first accommodation unit 412a and the second accommodation unit 412b. Accommodation grooves may be formed by the first accommodation unit 412a, the second accommodation unit 412b, and the connection unit 412c, and the guide unit 412 may have guide projections 412d in the accommodation grooves.

The magnetic levitation bearing may be disposed in the connection unit 412c of the guide unit 412 to correspond to each of both sides of the carrier 431. The magnetic levitation bearing may generate a gap between the carrier 431 and the guide unit 412 so that the carrier 431 may be transported along the guide unit 412 without contacting the guide unit 412 (in a non-contact manner). The magnetic levitation bearing may be disposed on the second accommodation unit 412b of the guide unit 412 to be located above the carrier 431. In this case, the magnetic levitation bearing allows the carrier 431 to move along the guide unit 412 while maintaining a constant gap with the first accommodation unit 412a or the second accommodation unit 412b. In order to confirm the gap between the carrier 431 and the guide unit 412, the guide unit 412 may include a gap sensor that is disposed on the first accommodation unit 412a and/or the connection unit 412c to correspond to a lower part of the carrier 431.

A magnetic force of the magnetic levitation bearing may be changed according to a value measured by the gap sensor, and thus the gap between the carrier 431 and the guide unit 412 may be controlled in real time. That is, the carrier 431 may be precisely transported by a feedback control using the magnetic levitation bearing and the gap sensor.

After completing the deposition by passing through the deposition unit 100, the second transport unit 420 may transport the moving unit 430, which is separated from the substrate in the unloading unit 300, back to the loading unit 200. The second transport unit 420 may include the coil 421 and the roller guide 422 disposed on the lower housing 103 and the charging track 423 that is the same as the one described above. For example, the coil 421 and the charging track 423 are disposed on an inner surface at an upper part of the lower housing 103, and the roller guide 422 is disposed at each of both sides of the inner surface of the lower housing 103. Here, although not shown in the drawing, the coil 421 may be disposed in the atmosphere box, the same as the coil 411 of the first transport unit 410.

The coil 421 may form (construct) a linear motor together with the magnetic rail 431b of the carrier 431 of the moving unit 430, the same as the coil 411. The moving unit 430 may be transported in the opposite direction (−Y direction) of the first direction (+Y direction) by the linear motor.

The roller guide 422 guides the carrier 431 to move in the opposite direction of the first direction. The roller guide 422 may be disposed so as to penetrate the deposition unit 100. The roller guide 422 supports cam followers that are disposed at both sides of the carrier 431 to guide the moving unit 430 to be transported in the opposite direction (−Y direction) of the first direction (+Y direction).

Because the second transport unit 420 transports the moving unit 430, from which the substrate 2 is separated, back to the loading unit 200, precise location of the moving unit 430 is not required compared to the first transport unit 410, which transports the moving unit 430 fixed with the substrate 2 so that the deposition may be performed on the substrate 2. Thus, a magnetic levitating function may be applied to the first transport unit 410, of which highly precise location of the moving unit 430 is required, to obtain the highly precise location of the moving unit 430, and a comparable roller method may be applied to the second transport unit 420 to simplify a structure of a deposition apparatus, and thus a manufacturing cost may be reduced. If necessary, a magnetic levitating function may be applied to the second transport unit 420.

The deposition assembly 100-1 is spaced apart from the substrate 2 at a set or predetermined distance and deposits a material on the substrate 2 while the first transport unit 410 transports the substrate 2 fixed to the moving unit 430 in the first direction (+Y direction). Hereinafter, a structure of the deposition assembly 100-1 will be described in more detail.

The deposition assembly 100-1 may include a deposition source 110, a deposition source nozzle unit 120, a patterning slit sheet 130, a blocking member 140, a first stage 150, a second stage 160, a camera 170, and a sensor 180. Here, most of the elements shown in FIGS. 7 and 8 may be disposed in the chamber 101 that is maintained at an appropriate degree of vacuum in order to move a deposition material 115 in a straight line.

The deposition source 110 may evaporate (radiate) the deposition material 115. The deposition source 110 may be located at a lower part of the deposition apparatus, and thus the deposition material 115 may be evaporated (radiated) in a direction (e.g., upward, such as +Z direction) toward the substrate 2 as the deposition material 115 housed in the deposition source 110 sublimates/evaporates. In particular, the deposition source 110 may include a furnace 111 that is filled with the deposition material 115 and a heater 112 for heating the furnace 111 to evaporate the deposition material 115 filled in the furnace 111.

The deposition source nozzle unit 120 of the deposition source 110, in which a deposition nozzle 121 is formed, is disposed in a direction toward the first transport unit 410 (+Z direction), i.e., a direction toward the substrate 2. In the drawing, the deposition source nozzle unit 120 includes a plurality of deposition nozzles 121. The deposition source nozzle unit 120 may include nozzles of a simple hole kind, and not a projection kind.

The patterning slit sheet 130 may be disposed facing the deposition source nozzle unit 120 and may be the same as the patterning slit sheet 130 according to one of the embodiments described above. The patterning slit sheet 130 may be interposed between the deposition source 110 and the substrate 2. The deposition material 115 evaporated from the deposition source 110 may pass the deposition source nozzle unit 120 and the patterning slit sheet 130 and then deposited on the substrate 2, which is a deposition target.

In order to deposit the deposition material 115 discharged from the deposition source 110 to the substrate 2 in a desired pattern after the deposition material 115 passes the deposition source nozzle unit 120 and the patterning slit sheet 130, an inside of a chamber (101) needs to be maintained at a high vacuum state the same as/similar to the case of a FMM deposition. Also, a temperature of the patterning slit sheet 130 (about 100° C. or lower) needs to be sufficiently lower than a temperature of the deposition source 110. That is because a temperature of the patterning slit sheet 130 needs to be low enough so that thermal expansion of the patterning slit sheet 130 may be reduced or minimized. That is, when a temperature of the patterning slit sheet 130 increases, sizes or locations of the patterning slits of the patterning slit sheet 130 may be deformed (modified) due to the thermal expansion, and thus the deposition material 115 may be deposited on the substrate 2 in a pattern that is different from the set or predetermined pattern.

The substrate 2, which is a deposition target, is disposed in the chamber 101. The substrate 2 may be a substrate for flat panel displays. A large substrate, such as a mother glass, for manufacturing a plurality of flat panel displays, may be used as the substrate 2.

In the comparable deposition method using a FMM, a size of the FMM has to be equal to the size of a substrate. Thus, the size of the FMM has to be increased as the substrate becomes larger. In this regard, manufacture of the FMM is not easy, and an interlayer formed in an accurate set or predetermined pattern is not possible because a mask is sagged due to a self-weight of the FMM.

However, in the case of the deposition apparatus according to the current embodiment, deposition may be performed while the deposition assembly 100-1 or the substrate 2 is moved relative to each other. Particularly, the deposition assembly 100-1, which is spaced apart at a set or predetermined distance from the substrate 2, deposits the deposition material 115 on the substrate 2 while the first transport unit 410 transports the substrate 2 fixed to the moving unit 430 in the first direction (+Y direction). In other words, deposition may be performed in a scanning manner while the substrate 2 disposed to face the deposition assembly 100-1 is moved in a direction of arrow A in FIG. 3. Although the drawing shows that deposition is performed while the substrate 2 is moving in the +Y direction in the chamber 101, the present invention is not limited thereto. For example, deposition may be performed while the deposition assembly 100-1 is moved in the −Y direction, while a location of the substrate 2 is fixed.

Thus, in the case of the deposition apparatus according to the current embodiment, a size of the patterning slit sheet 130 may be formed significantly smaller than a size of a comparable FMM. That is, in the case of the deposition apparatus according to the current embodiment, deposition is continuously performed, i.e., in a scanning manner, as the substrate 2 moves in a direction along the Y-axis. The deposition may be sufficiently performed with respect to an entire surface of the substrate 2 even when a length in a Y-axis direction of the patterning slit sheet 130 is significantly shorter than a length in a Y-axis direction of the substrate 2.

As described above, because the patterning slit sheet 130 may be significantly smaller than a FMM used in the comparable deposition method, it is relatively easy to manufacture the patterning slit sheet 130. In other words, using the patterning slit sheet 130, which is smaller than a FMM used in the comparable deposition method, is more convenient in all processes, including etching and other subsequent processes, such as precise extension, welding, moving, and cleaning processes, compared to the comparable deposition method using the larger FMM. This is an enhancement for a relatively large display device.

As described above, the deposition assembly 100-1 deposits the deposition material 115 on the substrate 2 at a set or predetermined distance while the first transport unit 410 transports the substrate 2 fixed to the moving unit 430. This indicates that the patterning slit sheet 130 is disposed apart from the substrate 2 at a set or predetermined distance. Therefore, the defects that are caused due to the contact between a substrate and a FMM, which occur in the comparable deposition method, may be effectively reduced or prevented. In addition, because it is unnecessary to contact the substrate with the mask during a deposition process, the manufacturing speed may be improved.

As shown in FIG. 8, the upper housing 104 may have the deposition source 110 and settle units 104-1 that are protruding at both sides of the deposition source nozzle unit 120. The first stage 150 and the second stage 160 are disposed on each of the settle units 104-1, and the patterning slit sheet 130 may be disposed on the second stage 160.

The first stage 150 may control a location of the patterning slit sheet 130 in an X-axis direction and a Y-axis direction. That is, the first stage 150 may include a plurality of actuators and thus moves the location of the patterning slit sheet 130 with respect to the upper housing 104 in an X-axis direction and a Y-axis direction. The second stage 160 may control a location of the patterning slit sheet 130 in a Z-axis direction. For example, the second stage 160 may include actuators to control the location of the patterning slit sheet 130 with respect to the first stage 150, i.e., with respect to the upper housing 104, in a Z-axis direction.

In this regard, a location of the patterning slit sheet 130 with respect to the substrate 2 may be controlled by the first stage 150 and the second stage 160, and thus alignment between the substrate 2 and the patterning slit sheet 130 may be performed, particularly, in real-time.

Moreover, the upper housing 104, the first stage 150, and the second stage 160 may guide pathways of the deposition material 115 at the same time, and thus the deposition material 115 that is discharged through the nozzle 121 may not be dispersed. That is, the pathways of the deposition material 115 are restricted by the upper housing 104, the first stage 150, and the second stage 160, and thus movement of the deposition material 115 in an X-axis direction may be limited.

The deposition assembly 100-1 may further include a camera 170 and a sensor 180 for the alignment. The sensor 180 may be a confocal sensor. The camera 170 confirms a first mark on the patterning slit sheet 130 and a second mark on the substrate 2 and thus may generate a data for precisely aligning the patterning slit sheet 130 and the substrate 2 on the XY plane. The sensor 180 may generate a data with respect to a gap between the patterning slit sheet 130 and the substrate 2, and thus an appropriate gap may be maintained between the patterning slit sheet 130 and the substrate 2.

In this regard, a gap between the substrate 2 and the patterning slit sheet 130 may be measured in real time by using the camera 170 and the sensor 180, and thus the substrate 2 and the patterning slit sheet 130 may be aligned in real time. Therefore, location precision of the pattern may be improved.

The blocking member 140 may be interposed between the patterning slit sheet 130 and the deposition source 110 to block deposition of the deposition material 115 on a non-layer-formation region (i.e., non-deposition region) of the substrate 2. Although not shown in the drawing, the blocking member 140 may include two plates that are adjacent to each other. As the non-layer-formation region of the substrate 2 is blocked by the blocking member 140, deposition of the deposition material 115 on the non-layer-formation region of the substrate 2 may be simply and effectively reduced or prevented without a separate structure.

In the deposition apparatus, the patterning slit sheet 130 has the structure of one of the embodiments described above, and thus shape deformation (modification) of the plurality of patterning slits 131 in the slit area SA may be reduced or minimized. Also, by increasing stability of the sheet 133, the deposition material 115 may be precisely deposited on the substrate 2 in the set or predetermined pattern.

Here, the first direction, along which the plurality of patterning slits 131 of the sheet 130 are extended, may be the same as the A direction, in which the first transport unit 141 transports the substrate 2 that is fixed to the moving unit 430.

Although the deposition apparatus has been mainly described, the present invention is not limited thereto. For example, a method of manufacturing an organic light-emitting display apparatus using the deposition apparatus may belong to the scope of the present invention.

A method of manufacturing an organic light-emitting display apparatus according to another embodiment of the present invention may include transporting the moving unit 430 into the chamber 101 by using the first transport unit 410 that is disposed to penetrate the chamber 101 while the substrate 2 is fixed to the moving unit 430; and forming a layer by depositing a deposition material discharged from the deposition assembly 100-1 onto the substrate 2 while transporting the substrate 2 with respect to the deposition assembly 100-1 by using the first transport unit 410, wherein the deposition assembly 100-1 and the substrate 2 disposed in the chamber 101 are spaced apart at a set or predetermined interval. Then, after transporting the moving unit 430 from which the substrate 2 is separated back to the loading unit 200 by the second transport unit 420 that is disposed to penetrate the chamber 101, the moving unit 430 may be cyclically transported by the first transport unit 410 and the second transport unit 420.

In the method of manufacturing an organic light-emitting display apparatus, the deposition assembly may have the same configuration as the deposition assembly in the deposition apparatus according to one of the embodiments described above. In this case, the forming of the layer may be forming of a layer while the frame 135 is attached to the binding area BA of the sheet 133, and the frame 135 shields at least some dummy slits 131' of the plurality of dummy slits 131' of the first dummy slit area DSA1 and the second dummy slit area DSA2 of the sheet 133. In one embodiment, the forming of the layer may be forming of a layer while the frame 135 completely shields some dummy slits 131' most adjacent to the binding area BA among the plurality of dummy slits 131' of the first dummy slit area DSA1 and the second dummy slit area DSA2 of the sheet 133.

According to another embodiment of the present invention, a method of manufacturing an organic light-emitting display apparatus may include forming of a layer while the frame 135 is attached to the binding area BA of the sheet 133, and the prop unit 136 shields at least some dummy slits 131' of the plurality of dummy slits 131' of the first dummy slit area DSA1 and the second dummy slit area DSA2 of the sheet 133.

In particular, the prop unit 136 includes the first prop 136a and the second prop 136b, and the forming of the layer may be forming of a layer while the first prop 136a shields at least some of the dummy slits 131' of the first dummy slit area DSA1 of the sheet, and the second prop 136b shields at least some of the dummy slits 131' of the second dummy slit area DSA2 of the sheet. Here, the first prop 136a may be in contact with the first dummy slit area DSA1 of the sheet, and the second prop 136b may be in contact with the second dummy slit area DSA2 of the sheet, and thus stability of the sheet 133 may increase.

Here, the first prop 136a and the second prop 136b may be extended along the first direction (+Y direction) as shown in FIGS. 3 and 4, and in this case, a length of the first prop 136a and the second prop 136b extended in the first direction (+Y direction) may be equal to a length of the slit area SA of the sheet 133 extended in the first direction.

The first prop 136a may completely shield some of the dummy slits 131' of the first dummy slit area DSA1 most adjacent to the binding area BA, and the second prop 136b may completely shield some of the dummy slits 131' of the second dummy slit area DSA2 most adjacent to the binding area BA.

Figure 9:
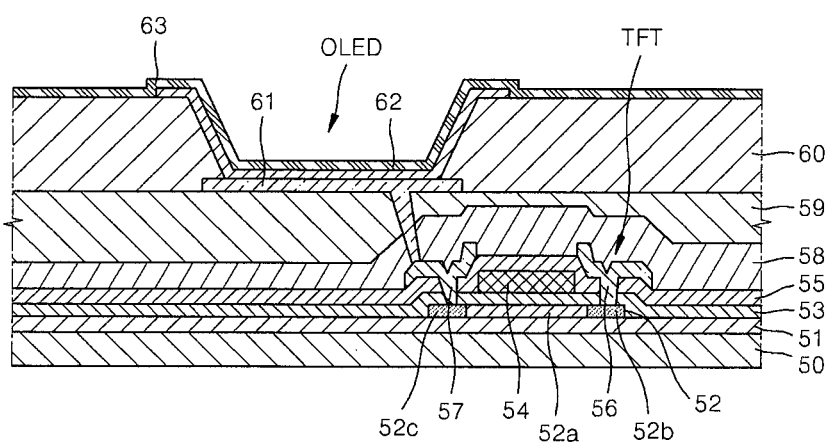
FIG. 9 is a schematic cross-sectional view illustrating an organic light-emitting display apparatus that is manufactured by using the deposition apparatus of FIG. 5.

FIG. 9 is a schematic cross-sectional view illustrating an organic light-emitting display apparatus that is manufactured by using the deposition apparatus of FIG. 5.

Referring to FIG. 9, all elements forming (constructing) the organic light-emitting display apparatus are formed on a substrate 50. Here the substrate 50 may be the substrate 2 described in FIG. 7 itself or a part cut off from the substrate 2. The substrate 50 may be formed of a transparent material, for example, glass, plastic, or metal.

A common layer, such as a buffer layer 51, a gate insulating layer 53, or an interlayer insulating layer 55, may be formed on an entire surface of the substrate 50. A patterned semiconductor layer 52 including a channel area 52a, a source contact area 52b, and a drain contact area 52c may be formed on the substrate 50. A gate electrode 54, a source electrode 56, and a drain electrode 57, which are elements of a thin film transistor, along with the patterned semiconductor layer may be formed on the substrate 50.

Also, a protection layer 58 covering the thin film transistor (TFT), and a flat layer 59 that is disposed on the protection layer 58 and has a flat upper surface may be formed on the entire surface of the substrate 50. An organic light-emitting diode (OLED) may be formed on the flat layer 59. The OLED includes a patterned pixel electrode 61 and a counter electrode 63 and further includes an interlayer 62 having a multiple-layered structure including an emitting layer between the patterned pixel electrode 61 and the counter electrode 63. Unlike what is shown in FIG. 9, the interlayer 62 may include some layers that are common layers approximately corresponding to the entire surface of the substrate 50, and other layers that may be patterned layers corresponding to the pixel electrode 61. The pixel electrode 61 may be electrically connected to the TFT through via-holes. A pixel defining layer 60 having an opening that covers edges of the pixel electrode 61 and defines each of the pixel areas may be formed on the flat layer 59 to approximately correspond to the entire surface of the substrate 50.

In the case of the organic light-emitting display apparatus, at least some of the elements may be formed by using the deposition apparatus according to one of the embodiment described above or the method of manufacturing an organic light-emitting display apparatus described above.

For example, the interlayer 62 may be formed by using the deposition apparatus according to one of the embodiments described above or the method of manufacturing an organic light-emitting display apparatus described above. For example, a hole injection layer (HIL), a hole transport layer (HTL), an emission layer (EML), an electron transport layer (ETL), and an electron injection layer (EIL) that may be included in the interlayer 62 may be formed by using the deposition apparatus according to one of the embodiments described above or the method of manufacturing an organic light-emitting display apparatus according to one of the embodiments described above.

That is, when each layer of the interlayer 62 is formed, deposition may be performed while one of a deposition assembly and a substrate moves relative to the other while the deposition assembly having a deposition source, a deposition source nozzle unit, and a patterning slit sheet is spaced (distanced) apart at a set or predetermined distance from a deposition target, which is, particularly, the substrate including the pixel electrode 61.

As shown in FIG. 1, the patterning slit sheet may include the plurality of patterning slits 131 that are extended along the first direction (+Y direction) and arranged (spaced apart) along the second direction (−X direction) in the slit area SA. Also, a layer of the interlayer 62 is formed while the substrate moves relatively in the first direction with respect to the deposition assembly, and thus the layer may have a linear pattern. The layer may be, for example, an emission layer.

As described above, the deposition apparatus of FIG. 5 may perform deposition on a substrate of a large area precisely onto a set or predetermined region. Therefore, the interlayer 62 may be precisely formed even when the organic light-emitting display apparatus has a size of 40 inches or greater, and thus an organic light-emitting display apparatus with high quality may be manufactured.

As described above, according to the one or more of the above embodiments of the present invention, a patterning slit sheet through which a slit area is appropriately secured while preventing deformation (modification) of patterning slits in the slit area, a deposition apparatus including the same, a method of manufacturing an organic light-emitting display apparatus using the same, and an organic light-emitting display apparatus manufactured by using the method are provided. However, the scope of the present invention is not limited thereto.

While the present invention has been particularly shown and described with reference to some example embodiments thereof, it will be understood by those of ordinary skill in the art that various changes in form and details may be made therein without departing from the spirit and scope of the present invention as defined by the following claims, and equivalents thereof.

What is claimed is:

1. A method of manufacturing an organic light-emitting apparatus, the method comprises:
   transporting a moving unit to which a substrate is fixed to a chamber by using a first transport unit;
   forming a layer by depositing a deposition material discharged from a deposition assembly while relatively transporting the substrate with respect to the deposition assembly by using the first transport unit while the deposition assembly and the substrate disposed in the chamber are spaced apart at a set interval; and
   returning the moving unit from which the substrate is separated back by using a second transport unit that is configured to penetrate the chamber,
   wherein the deposition assembly comprises a deposition source configured to evaporate the deposition material, a nozzle unit disposed to face toward the first transport unit and having a deposition source nozzle, and a patterning slit sheet facing the deposition nozzle unit and having a sheet and a frame attached to the sheet,
   wherein the sheet comprises a slit area, a first dummy slit area, a second dummy slit area, and a binding area, wherein the slit area has a plurality of patterning slits that are extended along a first direction and arranged along a second direction crossing the first direction, wherein the first dummy slit area is outside the slit area in the second direction and has a plurality of dummy slits that are extended along the first direction and arranged along the second direction, wherein the second dummy slit area is outside the slit area in an opposite direction of the second direction and has a plurality of dummy slits that are extended along the first direction and arranged along the second direction, wherein the binding area surrounds the slit area, the first dummy slit area, and the second dummy slit area;
   wherein the forming of the layer comprises forming of a layer while the frame is attached to the binding area of the sheet and configured to shield at least some of the plurality of the dummy slits of the first dummy slit area and the second dummy slit area of the sheet.

2. The method of claim 1, wherein the forming of the layer comprises forming of a layer while the frame is configured to completely shield a set of the plurality of dummy slits most adjacent to the binding area among the plurality of dummy slits of the first dummy slit area and the second dummy slit area of the sheet.

3. A method of manufacturing an organic light-emitting apparatus, the method comprises:
   transporting a moving unit to which a substrate is fixed to a chamber by using a first transport unit;
   forming a layer by depositing a deposition material discharged from a deposition assembly while relatively transporting the substrate with respect to the deposition assembly by using the first transport unit while the deposition assembly and the substrate disposed in the chamber are distanced apart at a set interval; and
   returning the moving unit from which the substrate is separated back by using a second transport unit configured to penetrate the chamber;
   wherein the deposition assembly comprises a deposition source configured to evaporate the deposition material, a nozzle unit disposed to face toward the first transport unit and having a deposition source nozzle, and a patterning slit sheet facing the deposition nozzle unit and having a sheet, a frame attached to the sheet, and a prop unit attached to the frame,
   wherein the sheet comprises a slit area, a first dummy slit area, a second dummy slit area, and a binding area, wherein the slit area has a plurality of patterning slits that are extended along a first direction and arranged along a second direction crossing the first direction, wherein the first dummy slit area is outside the slit area in the second direction and has a plurality of dummy slits that are extended along the first direction and arranged along the second direction, wherein the second dummy slit area is outside the slit area in an opposite direction of the second direction and has a plurality of dummy slits that are extended along the first direction and arranged along the second direction, wherein the binding area surrounds the slit area, the first dummy slit area, and the second dummy slit area;
   wherein the forming of the layer comprises forming of a layer while the frame is attached to the binding area of the sheet, and the prop unit is configured to shield at least some of the plurality of the first dummy slit area and the second dummy slit area of the sheet.

4. The method of claim 3, wherein the prop unit comprises a first prop and a second prop, wherein the forming of the layer comprises forming a layer while the first prop shields at least one dummy slit among the plurality of dummy slits of the first dummy slit area of the sheet, and the second prop shields at least one dummy slit among the plurality of dummy slits of the second dummy slit area of the sheet.

5. The method of claim 4, wherein the first prop and the second prop are extended along the first direction.

6. The method of claim 5, wherein a length of the first prop and the second prop in the first direction is equal to a length of the slit area of the sheet in the first direction.

7. The method of claim 4, wherein the first prop is in contact with the first dummy slit area of the sheet, and the second prop is in contact with the second dummy slit area of the sheet.

8. The method of claim 4, wherein the first prop is configured to completely shield a dummy slit most adjacent to the binding area among the plurality of dummy slits of the first dummy slit area, and the second prop is configured to completely shield a dummy slit most adjacent to the binding area among the plurality of dummy slits of the second dummy slit area.

* * * * *